(12) United States Patent
Sunada et al.

(10) Patent No.: US 10,746,478 B2
(45) Date of Patent: Aug. 18, 2020

(54) SILICON BIPOROUS WICK FOR HIGH HEAT FLUX HEAT SPREADERS

(71) Applicant: California Institute of Technology, Pasadena, CA (US)

(72) Inventors: Eric T. Sunada, Alhambra, CA (US); Karl Y. Yee, Pasadena, CA (US); Sean W. Reilly, Pasadena, CA (US)

(73) Assignee: CALIFORNIA INSTITUTE OF TECHNOLOGY, Pasadena, CA (US)

( * ) Notice: Subject to any disclaimer, the term of this patent is extended or adjusted under 35 U.S.C. 154(b) by 240 days.

(21) Appl. No.: 15/376,288

(22) Filed: Dec. 12, 2016

(65) Prior Publication Data

US 2017/0167800 A1    Jun. 15, 2017

Related U.S. Application Data

(60) Provisional application No. 62/266,188, filed on Dec. 11, 2015.

(51) Int. Cl.
| | |
|---|---|
| *F28D 15/00* | (2006.01) |
| *F28D 15/04* | (2006.01) |
| *H01L 23/427* | (2006.01) |
| *F28F 21/04* | (2006.01) |

(52) U.S. Cl.
CPC .......... *F28D 15/046* (2013.01); *H01L 23/427* (2013.01); *F28F 21/04* (2013.01)

(58) Field of Classification Search
CPC ..... F28D 15/046; F28D 15/04; H01L 23/427; F28F 21/04; F28F 21/02
USPC .................................................. 165/104.26
See application file for complete search history.

(56) References Cited

U.S. PATENT DOCUMENTS

| | | | | |
|---|---|---|---|---|
| 5,761,037 | A * | 6/1998 | Anderson | F28D 15/0266 165/104.26 |
| 5,769,154 | A * | 6/1998 | Adkins | F28D 15/0233 126/96 |
| 6,056,044 | A * | 5/2000 | Benson | F28D 15/0233 165/104.26 |
| 7,422,053 | B2 * | 9/2008 | Siu | F28D 15/0233 165/104.26 |
| 8,434,225 | B2 * | 5/2013 | Mahefkey | F28D 15/046 165/104.21 |
| 8,685,268 | B1 * | 4/2014 | Yee | H01M 4/1395 216/67 |
| 8,807,203 | B2 * | 8/2014 | MacDonald | F28D 15/04 165/104.26 |
| 9,120,190 | B2 * | 9/2015 | Schwartz | B23P 15/26 |
| 9,362,201 | B2 * | 6/2016 | Gavillet | F28D 15/046 |
| 9,404,392 | B2 * | 8/2016 | Kare | F01K 11/00 |
| 9,752,832 | B2 * | 9/2017 | Kare | F28D 15/04 |
| 9,841,246 | B2 * | 12/2017 | Lin | F28D 15/0233 |
| 9,953,895 | B2 * | 4/2018 | Ancey | H01L 23/427 |

(Continued)

OTHER PUBLICATIONS

Yee, K., et al, "Micro-Textured Black Silicon Wick for Filicon Heat Pipe Array", NASA Tech Briefs Mar. 2013.*

(Continued)

*Primary Examiner* — Claire E. Rojohn, III
(74) *Attorney, Agent, or Firm* — Gates & Cooper LLP

(57) ABSTRACT

A wicking structure comprising a biporous wick formed with a semiconductor (e.g., silicon), wherein the biporous wick comprises first pores and second pores formed by the semiconductor and the first pores are larger than the second pores.

22 Claims, 5 Drawing Sheets

(56) References Cited

U.S. PATENT DOCUMENTS

| | | | |
|---|---|---|---|
| 9,982,949 B2* | 5/2018 | Yamashita | F28D 15/046 |
| 10,018,428 B2* | 7/2018 | Altman | F28F 21/08 |
| 10,096,537 B1* | 10/2018 | Chen | H01L 23/427 |
| 2003/0141045 A1* | 7/2003 | Oh | F28D 15/046 |
| | | | 165/104.26 |
| 2005/0280162 A1* | 12/2005 | Mok | H01L 23/427 |
| | | | 257/778 |
| 2007/0089864 A1* | 4/2007 | Chang | F28D 15/0233 |
| | | | 165/104.26 |
| 2009/0056917 A1* | 3/2009 | Majumdar | F28D 15/0233 |
| | | | 165/104.26 |
| 2009/0159243 A1* | 6/2009 | Zhao | F28D 15/046 |
| | | | 165/104.26 |
| 2009/0242175 A1* | 10/2009 | Basavanhally | F28D 15/046 |
| | | | 165/104.26 |
| 2009/0314472 A1* | 12/2009 | Kim | F28D 15/043 |
| | | | 165/104.26 |
| 2010/0200199 A1* | 8/2010 | Habib | C25D 7/00 |
| | | | 165/104.26 |
| 2010/0294467 A1* | 11/2010 | Varanasi | F28D 15/046 |
| | | | 165/108 |
| 2011/0146956 A1* | 6/2011 | Stroock | F28D 15/046 |
| | | | 165/104.26 |
| 2012/0111539 A1* | 5/2012 | Dai | F28D 15/046 |
| | | | 165/104.26 |
| 2013/0032311 A1* | 2/2013 | Bhunia | H01L 23/3675 |
| | | | 165/104.26 |
| 2014/0196498 A1* | 7/2014 | Xiao | H01L 23/427 |
| | | | 62/524 |
| 2017/0167800 A1* | 6/2017 | Sunada | F28D 15/046 |
| 2017/0328646 A1* | 11/2017 | Zhou | F28D 15/0266 |
| 2018/0031330 A1* | 2/2018 | Roberts | H01L 23/427 |
| 2018/0201395 A1* | 7/2018 | Jung-Kubiak | F03H 1/0037 |

OTHER PUBLICATIONS

Miller, J., et al., "Performance Measurements and Modeling of a Silicon Two-Phase Heat Spreader", 41st Int. Conf. on Env. Systems (Jul. 2011), Portland, Oregon.

Reilly, S., et al., 2009, "Characterization of Vapor Escape Restriction in Biporous Wicks with Monolayers for Thermal Ground Plane Optimization", ASME IMECE, IMECE2009-12618.

Reilly, S., et al., 2010, "Advances in biporous wick design and testing for thermal ground planes", Frontiers in Heat Pipes, 1 (1).

Reilly S., et al., 2014. "Utilization of Pore-Size Distributions to Predict Thermophysical Properties and Performance of Biporous Wick Evaporators", ASME Journal of Heat Transfer, HT-13-1183.

Yee, K., et al. "Silicon Heat Pipe Array", NASA Tech Briefs Feb. 2013.

Yee, K., et al., "Micro-Textured Black Silicon Wick for Silicon Heat Pipe Array", NASA Tech Briefs Mar. 2013.

Semenic, T., "High Heat Flux Removal Using Biporous Heat Pipe Evaporators," Ph.D. thesis, 2007, pp. 1-206, UCLA, Los Angeles, CA.

\* cited by examiner

SILICON BIPOROUS WICK FOR HIGH HEAT FLUX HEAT SPREADERS

CROSS REFERENCE TO RELATED APPLICATIONS

This application claims the benefit under 35 U.S.C. Section 119(e) of commonly-assigned U.S. Provisional Patent Application Ser. No. 62/266,188, filed on Dec. 11, 2015, by Eric T. Sunada, Karl Y. Yee, and Sean W. Reilly, entitled "ETCHED SILICON BIPOROUS WICK FOR HIGH HEAT FLUX HEAT SPREADERS", (CIT-7381); which application is incorporated by reference herein.

STATEMENT REGARDING FEDERALLY SPONSORED RESEARCH AND DEVELOPMENT

The invention described herein was made in the performance of work under a NASA contract NNN12AA01C, and is subject to the provisions of Public Law 96-517 (35 USC 202) in which the Contractor has elected to retain title.

BACKGROUND OF THE INVENTION

1. Field of the Invention

This invention relates to a heat spreader or thermal ground plane (TGP) comprising a biporous wick.

2. Description of the Related Art (Note: This application references a number of different publications as indicated throughout the specification by one or more reference numbers in brackets, e.g., [x]. A list of these different publications ordered according to these reference numbers can be found below in the section entitled "References." Each of these publications is incorporated by reference herein.)

A device such as an electronic device, optoelectronic device, or computer processor generates heat during operation. Unless the heat is effectively extracted from the device, the device's performance will be degraded.

Many devices use cooling systems, such as fans and air coolers, to dissipate the unwanted heat. However, if the cooling system is not effectively coupled to the heat source in the device, the cooling system does not optimally dissipate the heat from the device.

A heat spreader can be used to transport heat from the heat source (such as an electronic or optoelectronic device, or a computer processor) to a heat sink (such as the cooling system). The heat sink may have a surface area and geometry that dissipates heat more effectively than the surface area and geometry of the heat source. For example, the heat sink may have a larger surface area than the heat source. The heat spreader may then spread the heat generated in the heat source onto the larger surface area, so that the heat from the heat source is dissipated more effectively into the environment.

However, there is a need in the art for heat spreaders that can reliably transport higher heat fluxes from the heat source. One or more embodiments of the present invention satisfy this need.

SUMMARY OF THE INVENTION

The present invention has made the surprising and unexpected discovery that a heat spreader comprising a vapor space and a microstructured biporous wick (constructed from a semiconductor, such as silicon), wherein the vapor space is tailored for use with the biporous wick, can reproducibly dissipate heat fluxes of at least 1 kilowatt per centimeter square (1 kW/cm$^2$).

One or more embodiments of the present invention disclose a wicking structure, comprising a biporous wick comprising a semiconductor, wherein the biporous wick comprises first pores and second pores formed by the semiconductor, and the first pores are larger than the second pores.

In one or more embodiments, the biporous wick comprises pyramidal structures formed from silicon/semiconductor, spaces between the pyramidal structures comprise first pores, and the surfaces of the pyramidal structures comprise second pores that are smaller than the first pores. In one example, the surfaces of pyramidal structures comprise black silicon. In one or more embodiments, the pyramidal structures have a base and sidewalls that slope towards each other.

The present invention further discloses a heat spreader or TGP comprising an evaporator (including the biporous wick), a condenser, and a vapor space between the condenser and the biporous wick (e.g., such that the evaporator is at a first side of the vapor space and the condenser is at a second side of the vapor space). The evaporator conducts heat from a heat source to a working fluid in the biporous wick, such that the heat vaporizes the working fluid into vapor that escapes into the vapor space. The vapor is transported, under a vapor pressure gradient and through the vapor space, to a condenser. The condenser condenses the vapor into a condensate comprising the working fluid, and the working fluid is collected in a wicking structure next to the condenser. Voids are created in the pores in the biporous wick as the working fluid is vaporized and escapes from the pores. The voids draw the condensate (comprising the working fluid) into the biporous wick under capillary action. The condensate may also return under gravity to the pores in the biporous wick. The cycle comprising vaporization of the working fluid from the biporous wick and return of the condensate comprising the working fluid to the biporous wick is performed sufficiently quickly to transport the desired heat flux from the heat source to the condenser.

The heat spreader/TGP is embodied in many ways, including, but not limited to, the following embodiments.

1. The condenser having a surface area that is at least 50 times larger than a surface area of the heat source.

2. The condenser and the evaporator of any of the preceding embodiments comprising one or more silicon wafers (e.g., a first silicon wafer including the condenser, a second silicon wafer including the evaporator, wherein the silicon wafers are hermetically bonded together to form the vapor space between the condenser and the evaporator).

3. The TGP/heat spreader comprising the microstructured wick of any of the preceding embodiments, wherein the TGP/heat spreader is monolithic in construction.

4. A monolithic silicon/semiconductor piece comprising the TGP/heat spreader (evaporator, condenser, and vapor space) and further comprising the biporous wick of any of the preceding embodiments.

5. The TGP/heat spreader of any of the preceding embodiments, wherein the TGP comprises an air cooled heat sink as an extension of the top surface of the TGP. The air cooled heat sink entirely eliminates any contact resistance resulting from the use of an attached heat sink.

6. The TGP of any of the preceding embodiments 1-3, wherein the TGP is integrated with "cold plates" where cold fluid is circulated.

7. The TGP/heat spreader of any of the preceding embodiments, wherein the TGP vapor space is optimized for high capacity heat spreading.

8. The heat spreader/TGP of any of the preceding embodiments, wherein first, larger pores have a first diameter of 100 micrometers-400 micrometers and the second, smaller pores have a second diameter of 10 micrometers to 50 micrometers.

The present disclosure further discloses a method of fabricating a wicking structure, comprising forming a semiconductor into a biporous wick, wherein the biporous wick comprises first pores and second pores, and the first pores are larger than the second pores.

BRIEF DESCRIPTION OF THE DRAWINGS

Referring now to the drawings in which like reference numbers represent corresponding parts throughout:

FIGS. 3a is a boiling regime map for the biporous material of FIG. 2.

FIG. 3b illustrates the first (1') stage (pure conduction) in boiling regime map of FIG. 3a.

FIG. 3c illustrates the second ($2^{nd}$) stage (boiling, vapor fills big pores) in the boiling regime map of FIG. 3a.

FIG. 3d illustrates the third ($3^{rd}$) stage (dry out of big pores, capillary limit) in the boiling regime map of FIG. 3a.

FIG. 3e illustrates the second ($2^{nd}$) stage (dry out of small pores, burn out) in the boiling regime map of FIG. 3a.

DETAILED DESCRIPTION OF THE INVENTION

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Technical Description

Figure 1:
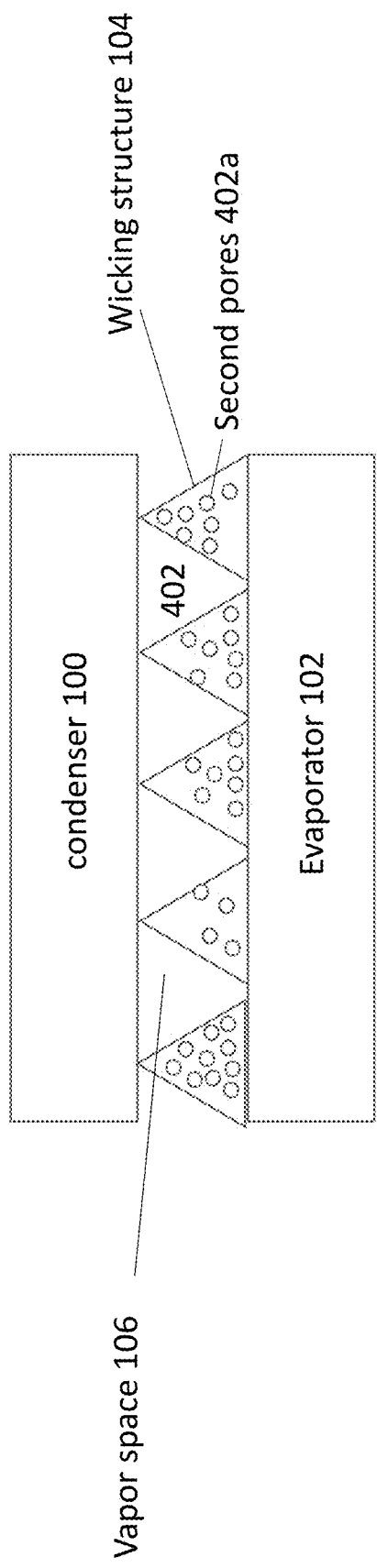
FIG. 1 is a cross-sectional schematic of a thermal ground plane (TGP) or heat spreader according to one or more embodiments of the present invention.

FIG. 1 illustrates a thermal ground plane (TGP) or heat spreader, comprising a condenser 100, an evaporator 102 (including wicking structure including biporous wick 104), and a vapor space 106.

In one or more embodiments, the wick at the evaporator side and the vapor space between the wick and the condenser side of the TGP are both optimized to accommodate/transport a heat flux of at least 1 kW/cm². In this case, design of the vapor space is crucial due to the losses associated with restriction of the vapor escape from the evaporator. In one or more embodiments where the condenser is approximately 100 times larger than the heat input area, efficient exposure of the escaping vapor to the condenser face is paramount.

Wicking Structure Example

The wick comprises a biporous wick including two distinct size distributions of pores. In one or more embodiments, the wick further comprises a monoporous interface layer introduced between the biporous material and the heater interface. The monoporous interface layer delays dry out and increases the performance of the biporous wick.

Figure 2:
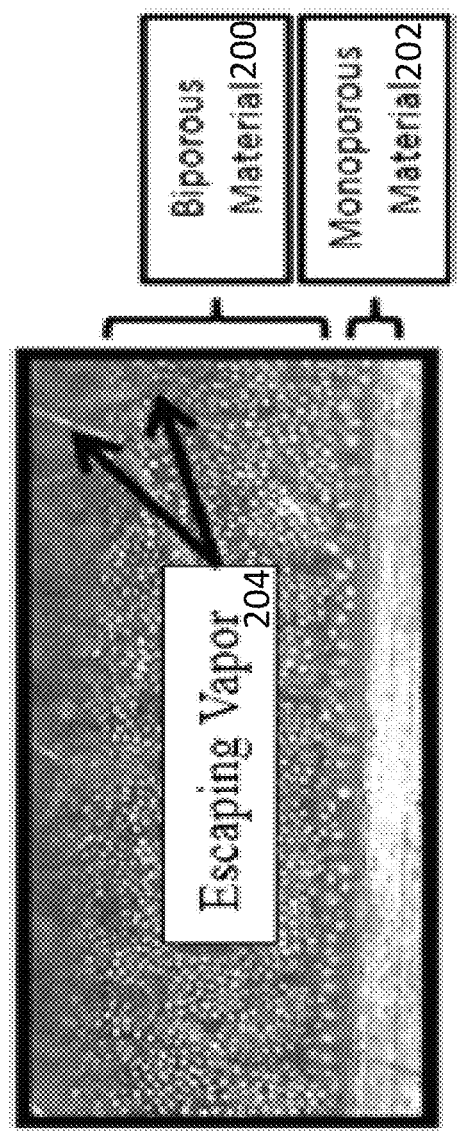
FIG. 2 is an image of a biporous material with monoporous interface layer.
Figure 3:
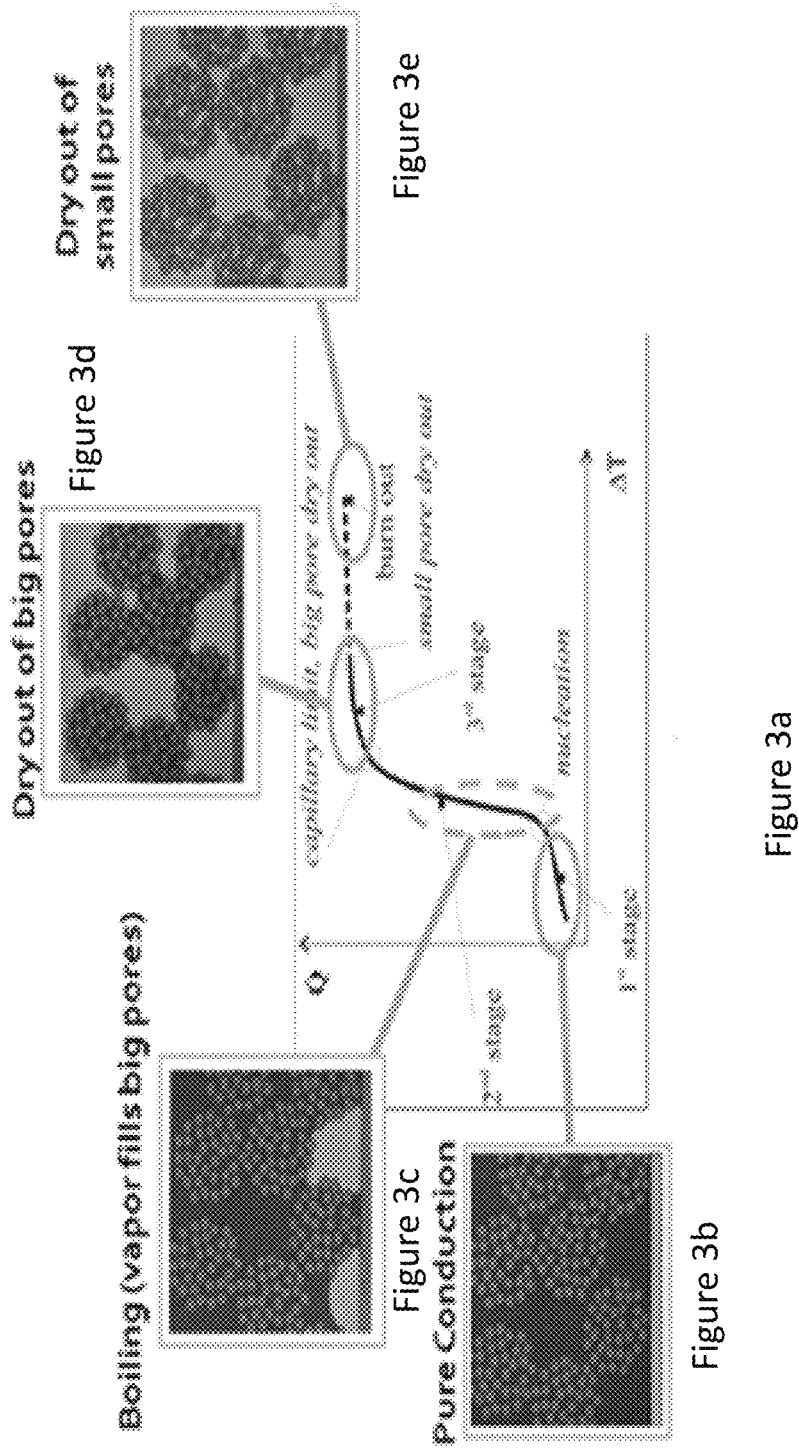

FIG. 2 illustrates a biporous wick fabricated using sintered copper, comprising biporous material 200 and monoporous material 202, and further illustrating escaping vapor 204.

FIGS. 3a-3e show how the two length scales of the pores ("small pores" and "large pores") provide a compound benefit: small pores provide high capillary pressure which can passively pump liquid to the surface of the evaporator, and large pores provide the necessary escape path to get vapor out from the evaporator with minimal losses. This technology has been shown to be capable of transporting a heat flux greater than 1 kW/cm² [4].

Figure 4:
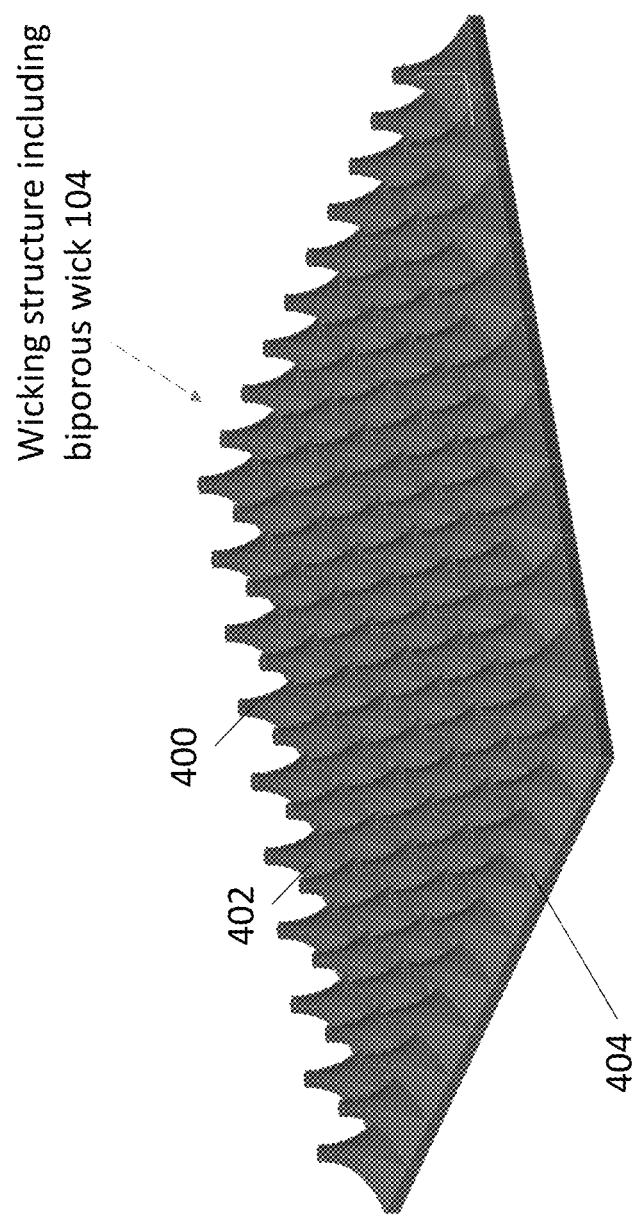
FIG. 4 is a schematic of an etched wick concept according to one or more embodiments of the present invention.

FIG. 4 illustrates a microstructured biporous wick comprising pyramidal structures 400 formed (e.g., etched or sintered) into the wick surface, wherein the large spaces 402 between the pyramids serve as "large pores" forming vapor channels allowing efficient transport of the working fluid into the vapor space and to the condenser. The surface 404 of the pyramids is etched with microstructures forming the "small pores". In one or more examples, the surfaces of the pyramids are etched with black silicon to form the "small pores."

In one or more embodiments, the pyramidal structures are tall enough to span the entire height of the TGP and provide structural support to the hermetically bonded condenser wafer.

In one or more examples, the microstructured wick has characteristic pore sizes on the order of 1-100 micrometers (μm), providing ample capillary pressure to maintain wetting on the evaporator surface.

In one or more examples, the microstructured wick (or the wafer from which the wick is fabricated) is thermally oxidized so as to render the wick hydrophilic.

In one or more examples, the biporous wick's distinct bimodal pore size distribution is tuned to achieve particular performance parameters. In one or more examples, the pore size and pore distribution are selected to maximize heat flux from the evaporator to the condenser and/or to accommodate/transport a heat flux of at least 1 kW/cm²).

In one or more embodiments, the pore size distribution in the wick is used to construct a model [1] of how the liquid and vapor interact to maximize TGP/heat spreader performance.

Vapor Space Design

In one or more embodiments, the vapor space is optimized by relating the mass flow rate of the vapor with the hydrodynamic properties of the vapor space, as has been done previously [2,3]. Experimental results obtained for uniform vapor space thickness devices have shown that any impedance to the vapor reaching the whole surface area of the condenser will reduce performance.

In one or more embodiments, the vapor space has a volume required to reach the desired heat flux (e.g., 1 kW/cm²).

In one or more embodiments, the vapor space is determined by analysis of the vapor space from first principles and using a design trade taking into account other limitations, such as the wick structure dimensions. In one or more examples, the vapor space is a function of the desired power input to the evaporator. In one or more examples, the analysis determines the maximum thickness of the wick with respect to the pressure drop of the vapor leaving the evaporator region. In one or more examples, the thickness of the wick is extended beyond the heat input area to further increase TGP performance.

Process Steps

Figure 5:
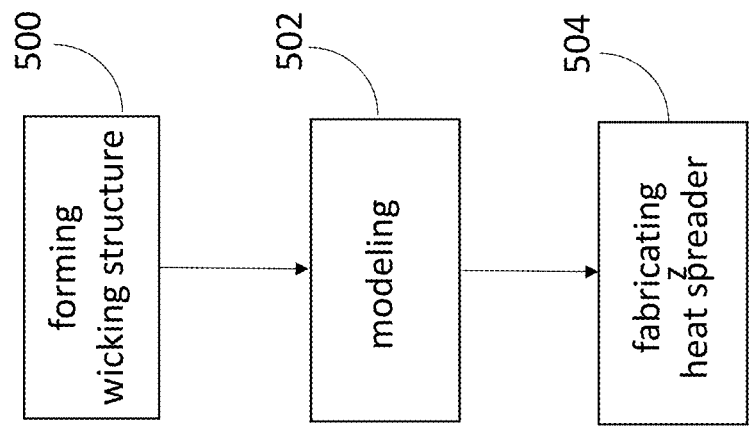
FIG. 5 is a flowchart illustrating a method of fabricating a heat spreader and/or wicking structure according to one or more embodiments of the present invention.

FIG. 5 is a flowchart illustrating a method of fabricating a heat spreader and/or wicking structure according to one or more embodiments of the present invention (referring also to FIG. 1 and FIG. 4).

Block 500 represents forming a biporous wick into a semiconductor (e.g., but not limited to, Si or a Si wafer), wherein the biporous wick comprises first pores 402 and second pores. The first pores are larger than the second pores.

In one or more embodiments, advanced manufacturing capabilities [6] enable the production of wicks with precise control over the relevant TGP properties.

In one or more embodiments, the forming comprises forming pyramidal structures 400 with the semiconductor, forming spaces between the pyramidal structures, wherein the spaces comprise the first pores 402. The forming further comprises forming the second pores into surfaces 404 of the pyramidal structures, either before or after assembly into the pyramidal structures. The pyramidal structures have a base 406 and sidewalls 404 that slope towards each other. In one or more embodiments, the pyramidal structures comprise or consist essentially of silicon, and the surfaces of pyramidal structures comprise or consist essentially of black silicon.

In one or more embodiments, the forming comprises etching (e.g., dry etching) the first pores 402 and the second pores into the semiconductor. For example, the etching comprises etching pyramidal structures 400 into the semiconductor, forming spaces between the pyramidal structures, wherein the spaces comprise the first pores 402; and etching the second pores into surfaces 404 of the pyramidal structures 400.

In one or more embodiments, the larger (first) pores have the diameter of 100 micrometers-400 micrometers and the smaller (second) pores have a diameter of 10 micrometers to 50 micrometers.

In one or more embodiments, the forming comprises sintering the semiconductor into the biporous wick comprising the first pores 402 and the second pores. In one or more embodiments, the sintering comprises packing balls of silicon (e.g., having a diameter of, e.g., 100 micrometers) into a mold; baking the silicon in the mold to the melting temperature of the silicon, thereby fusing the silicon balls together into a molded piece having a shape formed by the mold; and removing the molded piece from the mold, wherein the molded piece comprises biporous wick, the first pores, and the second pores. In one or more embodiments, the sintering forms the semiconductor into pyramidal structures 400, forming spaces including the first pores between the pyramidal structures, and the sintering forms the second pores into surfaces 404 of the pyramidal structures 400. In one or more embodiments, the mold comprises one or more molds having a shape to form the silicon/semiconductor into first pores 402 and/or the second pores.

In one or more embodiments, the forming comprises a combination of sintering and etching.

FIG. 4 illustrates the end result, a wicking structure comprising biporous wick comprising or consisting essentially of a semiconductor, wherein the biporous wick comprises first pores 402 and second pores formed by the semiconductor, and the first pores are larger than the second pores. In one or more embodiments, the first pores 402 have a first diameter/characteristic width or height of 100 micrometers-400 micrometers and the second pores have a second diameter/characteristic width or height of 10 micrometers to 50 micrometers.

Block 502 represents the optional step of modeling (e.g., in a computer) heat flux in a heat spreader comprising a condenser, a vapor space, and an evaporator comprising the biporous wick. The evaporator conducts heat from a heat source to a working fluid in the biporous wick, and the heat vaporizes the working fluid in the biporous wick into vapor that escapes into the vapor space. The vapor is transported under a pressure gradient towards the condenser, and the condenser, coupled to a cooling system, condenses the vapor into a condensate comprising the working fluid. The condensate is collected in a wicking structure next to the condenser. Voids are created in the pores in the biporous wick as the working fluid is vaporized and escapes into vapor space. The voids draw the condensate (including the working fluid) into the pores under capillary action. The condensate may also return to the pores through gravity.

The cycle comprising vaporization of the working fluid from the biporous wick and return of the condensate comprising the working fluid to the biporous wick is performed sufficiently quickly to transport the desired heat flux from the heat source to the condenser. This is achieved through proper dimensioning of the pores and the vapor space.

Examples of working fluid include, but are not limited to, water, ammonia, or pentane.

In one or more embodiments, the condenser has a surface area that is at least 50 times larger than a surface area of the heat source.

Block 504 represents fabricating the heat spreader comprising the evaporator 102 (including biporous wick 104 (e.g., as illustrated in FIG. 4)), the condenser 100, and the vapor space 106, wherein the evaporator 102 is at a first side of the vapor space 106 and the condenser 100 is at a second side of the vapor space 106. In one or more embodiments, the method comprises providing a first semiconductor (e.g., silicon) wafer comprising the evaporator; providing a second semiconductor (e.g., silicon) wafer comprising the condenser; and hermetically bonding the first semiconducting wafer to the second semiconducting wafer, wherein a vapor space is between the condenser and the evaporator. In one or more embodiments, the fabricating comprises monolithically forming a semiconductor (e.g., silicon) wafer to form a monolithic semiconductor piece (e.g., silicon piece) comprising the condenser, the evaporator, and the vapor space.

In one or more embodiments, an air cooler or cold plate is formed on a top surface of the condenser in the heat spreader.

Advantages and Improvements

There are several advantages to the microstructured wick approach.

The use of the innovative biporous wick of the present invention provides high heat flux capability in the heat spreader. Specifically, the biporous wick has a distinct advantage over traditional unimodal pore distribution wicks in that the biporous wick dramatically delays dry-out of the wick, thereby permitting the much higher heat fluxes.

The key innovation introduced by one or more embodiments of the present invention is the precise control over the TGP features relative to previous biporous wicks. For example, sintered copper biporous wicks are effective but difficult to produce consistently since the nature of their construction is somewhat random. One or more embodiments of the present invention, on the other hand, enable significantly more control over manipulation of the feature (e.g., pore) sizes and placement of the features, thereby producing TGPs having more consistent performance.

The microstructured wick design is scalable from small devices to larger devices and is commercially viable [5,7].

For example, modeling the performance of these types of wicks enables production of heat spreaders of various sizes and capabilities. Coupling analysis of the performance of the biporous wick with analysis that optimizes the vapor space enables fabrication of a TGP transporting higher heat fluxes. Combining innovative microstructuring of the biporous wick with innovative modeling of the vapor space, taking into account the synergistic interaction between the working fluid in the biporous wick and the vapor space, enables fabrication of a heat spreader/TGP with unexpected properties, such as significantly increased capability to transport and heat sink large heat fluxes.

In one or more embodiments, the TGP device is fabricated from Si and is mounted directly to high power density electronic components with minimal concern for coefficient of thermal expansion (CTE) mismatch, since many of the electronic components are Si based.

Si is not an obvious choice for use in a heat spreader/TGP because Si has significantly lower thermal conductivity compared to other materials (such as copper). However, the present invention has surprisingly and unexpectedly discovered that the low thermal conductivity can be mitigated by enhancing/increasing latent heat transfer from the evaporator to the condenser. In one or more embodiments, the latent heat transfer is increased by choosing the pore sizes to manipulate the meniscus shape of the working fluid in the pores, so that a high amount of thin film evaporation of the working fluid takes place. In one or more embodiments, the latent heat transfer is increased by fabricating the biporous wick consisting essentially of or comprising Si, wherein the biporous wick comprises the larger (first) pores 402 having the diameter/size/cross section of 100 micrometers-400 micrometers and the smaller (second) pores having a diameter/size/cross-section of 10 micrometers to 50 micrometers.

REFERENCES

The following references are incorporated by reference herein.

[1] Reilly S., Catton I., 2014. "Utilization of Pore-Size Distributions to Predict Thermophysical Properties and Performance of Biporous Wick Evaporators". ASME Journal of Heat Transfer, HT-13-1183.

[2] Catton I., Reilly S., Amouzegar L., 2010. "Advances in biporous wick design and testing for thermal ground planes". Frontiers in Heat Pipes, 1 (1).

[3] Reilly S., Catton I., 2009. "Characterization of Vapor Escape Restriction in Biporous Wicks with Monolayers for Thermal Ground Plane Optimization". ASME IMECE, IMECE2009-12618.

[4] Semenic, T., 2007. "High Heat Flux Removal Using Biporous Heat Pipe Evaporators," Ph.D. thesis, UCLA, Los Angeles, Calif.

[5] K. Yee, G. Ganapathi, E. Sunada, Y. Bae, J. Miller, D. Berisford, "Silicon Heat Pipe Array", NASA Tech Briefs February, 2013.

[6] K. Yee, E. Sunada, G. Ganapathi, H. Manohara, A. Homyk, M. Prina, "Micro-Textured Black Silicon Wick for Silicon Heat Pipe Array", NASA Tech Briefs March, 2013.

[7] J. Miller, K. Yee, E. Sunada, G. Ganapathi, Y. Bae, D. Berisford, "Performance Measurements and Modeling of a Silicon Two-Phase Heat Spreader", 41st Int. Conf. on Env. Systems (July 2011), Portland, Oreg.

[8] Reilly S., Catton I., 2014. "Utilization of Pore-Size Distributions to Predict Thermophysical Properties and Performance of Biporous Wick Evaporators". ASME Journal of Heat Transfer, HT-13-1183.

[9] Catton I., Reilly S., Amouzegar L., 2010. "Advances in biporous wick design and testing for thermal ground planes". Frontiers in Heat Pipes, 1 (1).

[10] Reilly S., Catton I., 2009. "Characterization of Vapor Escape Restriction in Biporous Wicks with Monolayers for Thermal Ground Plane Optimization". ASME IMECE, IMECE2009-12618.

Conclusion

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A heat spreader, comprising:
   a wicking structure comprising a biporous wick comprising a plurality of first pores and a plurality of second pores, wherein the first pores are larger than the second pores;
   an evaporator including the wicking structure or the wicking structure above the evaporator;
   a vapor space on top of the wicking structure; and
   a condenser on top of the vapor space, wherein:
     the evaporator conducts heat from a heat source to a working fluid in the biporous wick,
     the heat vaporizes the working fluid into vapor that escapes from the first pores,
     the vapor is transported to the condenser above the first pores and the second pores through the vapor space, and
     the condenser condenses the vapor into a condensate comprising the working fluid.

2. The heat spreader of claim 1, wherein: the biporous wick comprises a plurality of structures formed in a semiconductor, at least some of the structures are between the plurality of the first pores, surfaces of each of the structures comprise a plurality of second pores,
   voids are created in the first pores and the second pores as the vapor escapes through the first pores into the vapor space,
   the condensate is collected in the wicking structure, and
   the voids draw the condensate comprising the working fluid into the biporous wick under capillary action provided by the second pores.

3. The wicking structure of claim 1, wherein:
   the structures comprise pyramidal structures, and
   the surfaces of the pyramidal structures comprise the second pores.

4. The wicking structure of claim 3, wherein the pyramidal structures have a base and sidewalls that slope towards each other.

5. The wicking structure of claim 4, wherein the pyramidal structures comprise silicon and surfaces of pyramidal structures comprise black silicon.

6. A heat spreader comprising the wicking structure of claim 1, comprising:

the evaporator including the biporous wick, wherein the pyramidal structures are tall enough to span an entire height of the vapor space and provide structural support to the condenser.

7. The wicking structure of claim 2, wherein the semiconductor is silicon.

8. The heat spreader of claim 1, wherein the condenser has a surface area that is at least 50 times larger than a surface area of the heat source.

9. The heat spreader of claim 2, comprising:
the semiconductor comprising silicon;
a first silicon wafer including the condenser; and
a second silicon wafer including the evaporator, wherein the silicon wafers are hermetically bonded together to form the vapor space between the condenser and the evaporator.

10. A monolithic silicon piece comprising the heat spreader of claim 1.

11. The heat spreader of claim 1, wherein first pores have a first diameter of 100 micrometers-400 micrometers and the second pores have a second diameter of 10 micrometers to 50 micrometers.

12. A method of fabricating a heat spreader comprising:
forming a wicking structure comprising a biporous wick comprising a plurality of first pores and a plurality of second pores, wherein the first pores are larger than the second pores;
providing an evaporator including the wicking structure or the wicking structure above the evaporator;
providing a vapor space on top of the wicking structure; and
providing a condenser on top of the vapor space, wherein:
the evaporator conducts heat from a heat source to a working fluid in the biporous wick,
the heat vaporizes the working fluid into vapor that escapes from the first pores,
the vapor is transported to the condenser above the first pores and the second pores through the vapor space, and
the condenser condenses the vapor into a condensate comprising the working fluid.

13. The method of claim 12, further comprising:
modeling heat flux in a heat spreader comprising the evaporator including the biporous wick, the condenser, and a vapor space, wherein:
the biporous wick comprises a plurality of structures formed in a semiconductor, at least some of the structures are between the plurality of the first pores, surfaces of each of the structures comprise a plurality of second pores,
the condensate is collected in the wicking structure, and
the voids draw the condensate comprising the working fluid into the biporous wick under capillary action provided by the second pores.

14. The method of claim 12, wherein:
the structures comprise pyramidal structures and
the forming further comprises forming the second pores into the surfaces of the pyramidal structures.

15. The method of claim 14, wherein the pyramidal structures have a base and sidewalls that slope towards each other.

16. The method of claim 14, wherein the pyramidal structures comprise silicon and surfaces of pyramidal structures comprise black silicon.

17. The method of claim 12, wherein the semiconductor is silicon.

18. The method of claim 17, wherein the modeling selects a volume of the vapor space that depends on a thickness of the biporous wick and sizes of the pores.

19. The method of claim 17, wherein the condenser has a surface area that is at least 50 times larger than a surface area of the heat source.

20. The method of claim 12, further comprising monolithically forming a silicon piece comprising the condenser, the evaporator, and the vapor space, wherein the vapor space is between the condenser and the evaporator and the evaporator comprises the biporous wick.

21. A wicking structure, comprising:
a biporous wick comprising a plurality of first pores and a plurality of second pores; and
a monolithic piece consisting essentially of silicon;
wherein:
each of the first pores are larger than each of the second pores, and
the second pores are formed in the monolithic piece.

22. The heat spreader of claim 1, wherein:
the vapor is transported vertically from the wicking structure to the condenser vertically above the first pores, the second pores, and the evaporator, and
the first pores and the second pores are in contact with the vapor space.

* * * * *